United States Patent [19]

Sherman

[11] Patent Number: 4,924,179
[45] Date of Patent: May 8, 1990

[54] METHOD AND APPARATUS FOR TESTING ELECTRONIC DEVICES

[76] Inventor: Leslie H. Sherman, 214 Dumont Ave., Dumont, N.J. 07628

[21] Appl. No.: 405,899

[22] Filed: Aug. 6, 1982

Related U.S. Application Data

[63] Continuation of Ser. No. 859,679, Dec. 12, 1977, abandoned, which is a continuation-in-part of Ser. No. 681,903, Apr. 30, 1976, abandoned.

[51] Int. Cl.$^5$ ............................................. G01R 31/02
[52] U.S. Cl. .................................. 324/158 F; 324/537
[58] Field of Search ............... 324/158 P, 158 F, 72.5, 324/73 R, 73 PC, 51, 52, 405, 407–409; 200/51 R

[56] References Cited

U.S. PATENT DOCUMENTS 2,023,947  12/1935  Auble .................................. 324/408
2,578,288  12/1951  Cook .................................. 200/51 R

FOREIGN PATENT DOCUMENTS 2260257  8/1975  France .

OTHER PUBLICATIONS

Turner, R. P.; "Juke Box Analyzer"; Radio News; Sep. 1946; pp. 41–45, 145, 146, 147.
Korosec et al; "Programmable Connector"; IBM Tech. Dis. Bull.; vol. 15; No. 3; Aug. 1972; pp. 865–866, copy in 324–158p.

Primary Examiner—Ernest F. Karlsen
Attorney, Agent, or Firm—Sheldon H. Parker

[57] ABSTRACT

A device for detecting a fault in an electrical circuit which includes a plug-in electrical circuit module assembly such as, an I.C. or a printed circuit board. The device has a module socket for receiving the plug-in module and a terminal plug designed to fit in a socket provided for the plug-in module. An isolated test point, a switch and an unisolated test point are in series between each terminal of the module socket and the terminal point.

1 Claim, 5 Drawing Sheets

METHOD AND APPARATUS FOR TESTING ELECTRONIC DEVICES

CROSS REFERENCE TO RELATED APPLICATIONS

The instant application is a continuation of application Ser. No. 859,679, now abandoned, which application was a continuation-in-part of Ser. No. 681,903, now abandoned.

BACKGROUND OF THE INVENTION

1. Field of the Invention

This invention relates to fault location in electronic circuit, and more particularly to a method of isolating a fault to a single component, of a multiple component circuit and to a device for selectively isolating circuit portions of a plug-in electrical circuit module assembly.

2. Brief Description of the Prior Art

The integrated circuit and printed circuit board are responsible for much of miniaturization and manufacturing techniques employed in the electronics industry today. Test and service methods have been developed to speed testing of these devices. Such methods range from simple clip leads and "extender" printed circuit boards which facilitate clip lead and test probe attachment to intricate computer programs designed to "debug" entire printed circuit boards. Economically it is beyond the means of most electronics manufacturers to "debug" via a computer program. Yet the incentive to efficiently reduce test and calibration costs exists at all times.

Extenders such as found in U.S. Pat. Nos. 2,952,810 and 3,808,532 have come into demand because in the manufacture of electronic equipment, the necessity for compactness has resulted in the loss of adequate space within such equipment in which the proper testing of the components of the circuitry included therein can be accomplished. The advantages of testing circuits and components in their dynamic states and while being subjected toe very parametric value encountered in the usage of such equipment were sacrificed to the advantages of compactness. Optimum operational characteristics of such equipment are jeopardized by the lack of dynamic testing and accordingly the extenders are employed to render the suspected circuit readily and completely accessible for testing purposes while still being electrically connected to the basic equipment with full operational capabilities.

Similarly, in U.S. Pat. No. 3,147,054 the extenders are disclosed as having value in preventing inadvertent short circuits when testing closely packed components with a test probe.

It is thus seen that the basic approach has been substantially unchanged from the development of the extender for testing vacuum tubes as disclosed in U.S. Pat. No. 2,823,304, to the present time. It is noted that in the latter patent an extender is provided which, through the use of a rotatable switch, selectively makes contact with a vacuum tube pin or terminal and a voltmeter.

The purpose of fault testing can be to detect the presence of the fault and to determine the location of the fault. Conventionally, the test procedures and available devices contribute to the detection of faults but are lacking in their ability to localize a fault unless computer programs can be employed in the test procedure.

SUMMARY OF THE INVENTION

It has now been found that fault detecting and localizing can be greatly facilitated without resorting to complex computer programs but rather using conventional test instruments such as voltmeters, oscilloscopes and the like, through the use of a extender which can isolate sub-circuits and components.

The invention involves the steps of removing a plug-in electrical circuit module assembly from its socket in a primary circuit, inserting the module assembly into a test socket of a test device having a termination plug. The plug of the test device is inserted into the module assembly socket in the primary circuit. The test device further has a plurality of electrical conductive connectors between a plurality of terminals in the test socket and a plurality of terminals in the termination plug. Each of the conductors, or terminal, are provided with a switch and at least an isolated test point between its switch and the termination plug terminal. Preferably, a test point is also provided between each switch and each test socket terminal. A switch is selectively opened and a simulated signal is injected at the isolated test point corresponding to the open switch. Additionally test parameters can be determined at the isolated and unisolated test points, and subcircuits can be isolated and parameters determined.

A BRIEF DESCRIPTION OF THE DRAWINGS

The objects and advantages of the invention will become apparent from the following description, particularly when read in combination with the drawings, wherein.

DESCRIPTION OF THE PREFERRED EMBODIMENTS

The device of the present invention has its primary application in connection with integrated circuits (I.C.s) and printed circuit boards. However, it can be employed in any electrical circuit which employs a plug-in electrical circuit module assembly, The test device operates as an extender, as heretofore described in connection with prior art devices, but more importantly provides monitoring points for in-circuit testing of the circuitry of a plug-in module such as an I.C., and most critically, has switches to isolate selected portions of the electrical subcircuits associated with the module assembly. The device provides isolation test points to test the selected portions of the primary electrical circuit and can have unisolated test points for testing selected portions of the electrical circuitry of the module assembly while the selected portions are isolated from the primary circuitry. The device thus provides for the detecting and localizing of a fault by isolating sub-circuits. It is noted that the terms isolated test points and unisolated test points are defined in terms of their relationship to the plug-in module.

The isolated test points provide input points at which external signals can be injected to test the remaining circuitry by substituting a known good signal for the actual output of the plug-in module or through the use of external instrumentation or a simplified computer program. Alternatively, non-voltage measurements at the unisolated test points can be made with the switches open.

Figure 1:
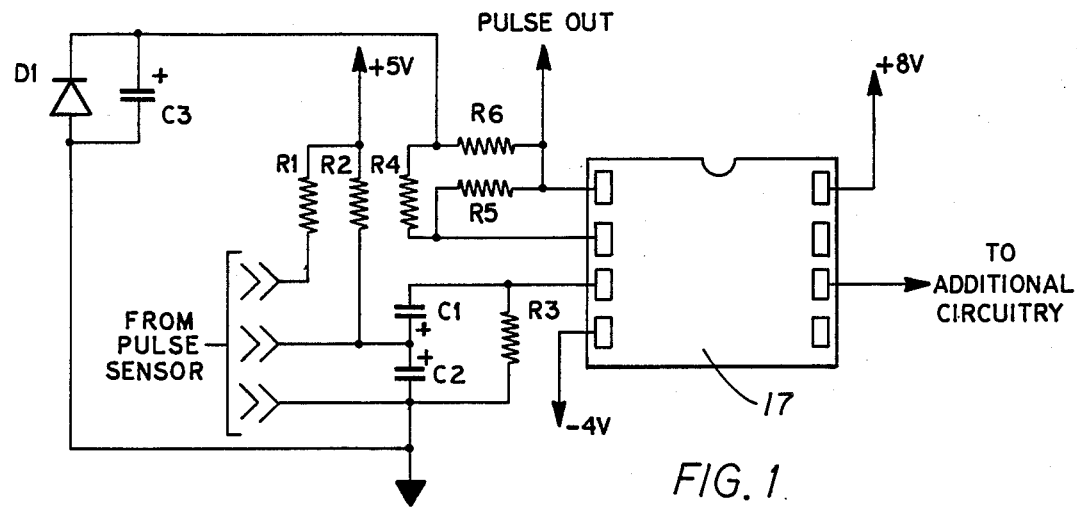
FIG. 1 is a schematic representation of a circuit showing a socket for an I.C.

FIG. 1 depicts a portion of a representative circuit having a socket 12 for an I.C. 30. The socket is represented as having eight terminals or contact points for receiving the terminal pins of the eight pin I.C. 30.

Figure 2:
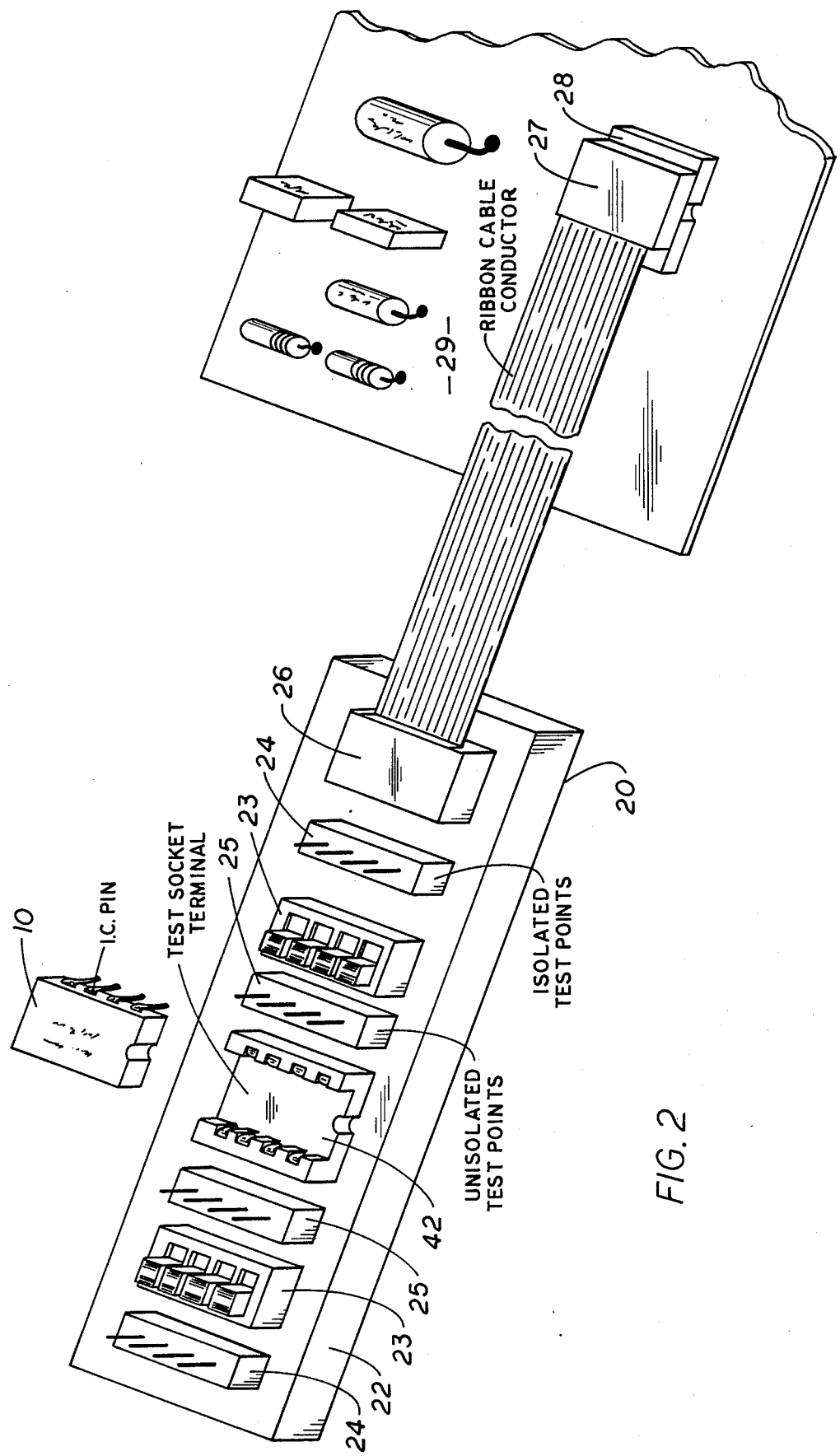
FIG. 2 is an exploded view of a test device of the present invention plugged into a socket of the type illustrated in FIG. 1.

FIG. 2 is an illustrative representation of a preferred embodiment of a test device according to the present invention. It is noted that while the figure shows a socket 42 for receiving an eight pin I.C., any mating I.C.- socket combination can be used.

The factor which is critical, is that the device provide a switch for independently isolating each I.C. terminal, printed circuit board terminal, or more generally, each electric circuit module assembly terminal and isolated test point.

Looking now in greater detail to the test device 20, of FIG. 2, it is seen that on a carrier member 22 is mounted a series of isolated test points 24, a series of switches 23, a test socket 42, a series of unisolated test points 25 and a termination plug 26 of any convenient design.

Preferably, a ribbon cable of convenient length is employed to provide a flexible, extended connection between the main body of the test device and the I.C. replacement termination plug 27. The plug 27 must have terminal pins corresponding to those of the I.C. it replaces so that it can be plugged into the I.C. receiving socket 28. The I.C. receiving socket may be contained on a printed circuit board 29. It is noted that the use of a conventional extender for the printed circuit board to space it from its' socket can add noise in some systems due to the extended electrical paths and the resistance of the conductors. By spacing only the I.C. from the closely packed components on a P.C. board, the noise problem can be eliminated.

The detecting and isolating of a fault to a single input of a multiple input plug-in module assembly can be accomplished through the use of computer programs or time consuming test procedures.

U.S. Pat. No. 3,777,129, for example, shows the complexity involved in using diagnostic programs for fault diagnosis.

Figure 3:
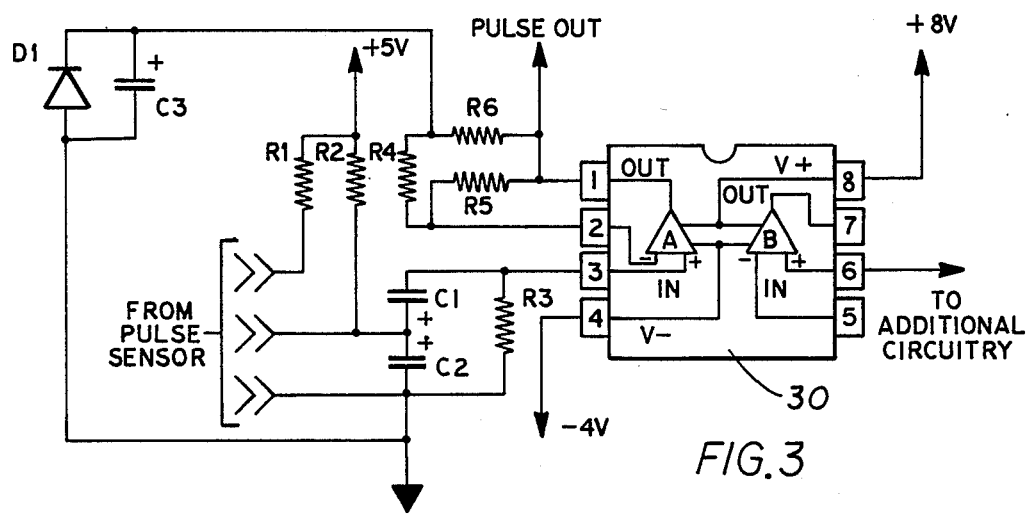
FIG. 3 is a schematic representation of the circuit of FIG. 1 in combination with the circuitry of an I.C.
Figure 4:
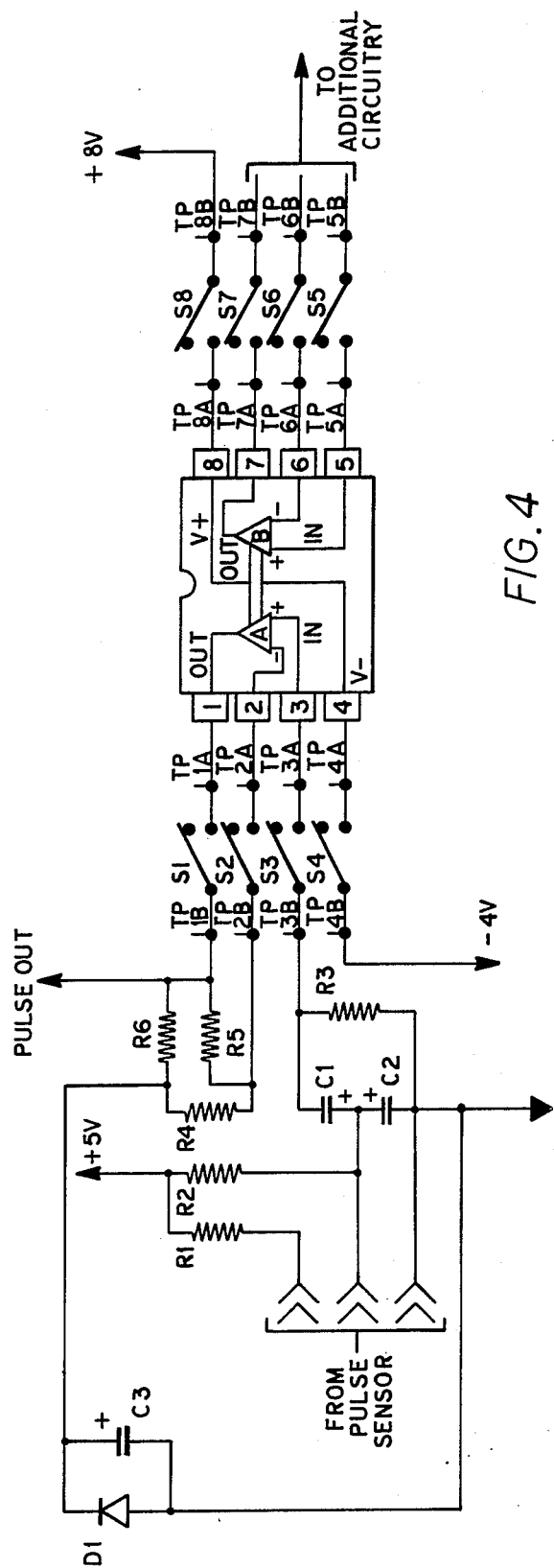
FIG. 4 is a schematic representation of the circuit of FIG. 3, with a test device of the present invention in operative position.

The operation of the test device of the present invention and its method of application can best be seen by means of a comparison of FIGS. 3 and 4.

The circuits of the two figures are functionally identical so long as the switches S1 thru S8 are closed. It is noted that for convenience FIG. 4 shows all of its switches in the open position.

The I.C. 50 is in electrical contact with an illustrative circuit, a portion of which is depicted in FIG. 3. In order to employ the test procedure, the I.C. 50 is removed from the circuit of FIG. 5 by being unplugged from I.C. socket 17, and is then plugged into the test socket 42, that is, the I.C. receiving socket of the test device 20. The termination plug 27 of the test device is then plugged into the I.C. socket 17 in place of the I.C. 10. The circuit is then as shown in FIG. 4 and through the selective opening or closing any combination of the switches S1 - S8, tests can be conducted.

As for example, switch S2 through S8 can be closed and switch S1 left open and a simulated signal corresponding to the proper out put of amplifier A can be introduced to the circuitry at the isolated test point ITP1. If the remaining circuitry works properly with the simulated circuit but is defective without the simulated signal and with the switch S1 closed, then assuming the inputs to amplifier A to have been determined to be good, then amplifier A is determined to be defective.

In a system in which an amplifier A and its related circuitry represents one part of a circuit and an amplifier B and its related circuitry represent another part of a circuit, it is apparent that one part of the circuit can be isolated without removing the I.C. or otherwise affecting the other part of the circuit. The test device thus provides the ability to run in-circuit tests of a plug-in component such as an I.C., and specifically to isolate independent circuits, take resistance readings on isolated components, inject simulated signals at isolated test points, and monitor at unisolated test points without damaging the contacts of the I.C. undergoing the test procedure.

The advantages which can be achieved by providing the ability to isolate selected portions of a circuit without functionally removing the plug-in type of electrical circuit module assembly from its socket include simplified programmed testing, complete isolation in part or in total of the circuitry of the plug-in component, reduced trouble shooting time to diagnose faulty components, and selective isolation to inhibit or enable particular circuit functions.

Figure 5:
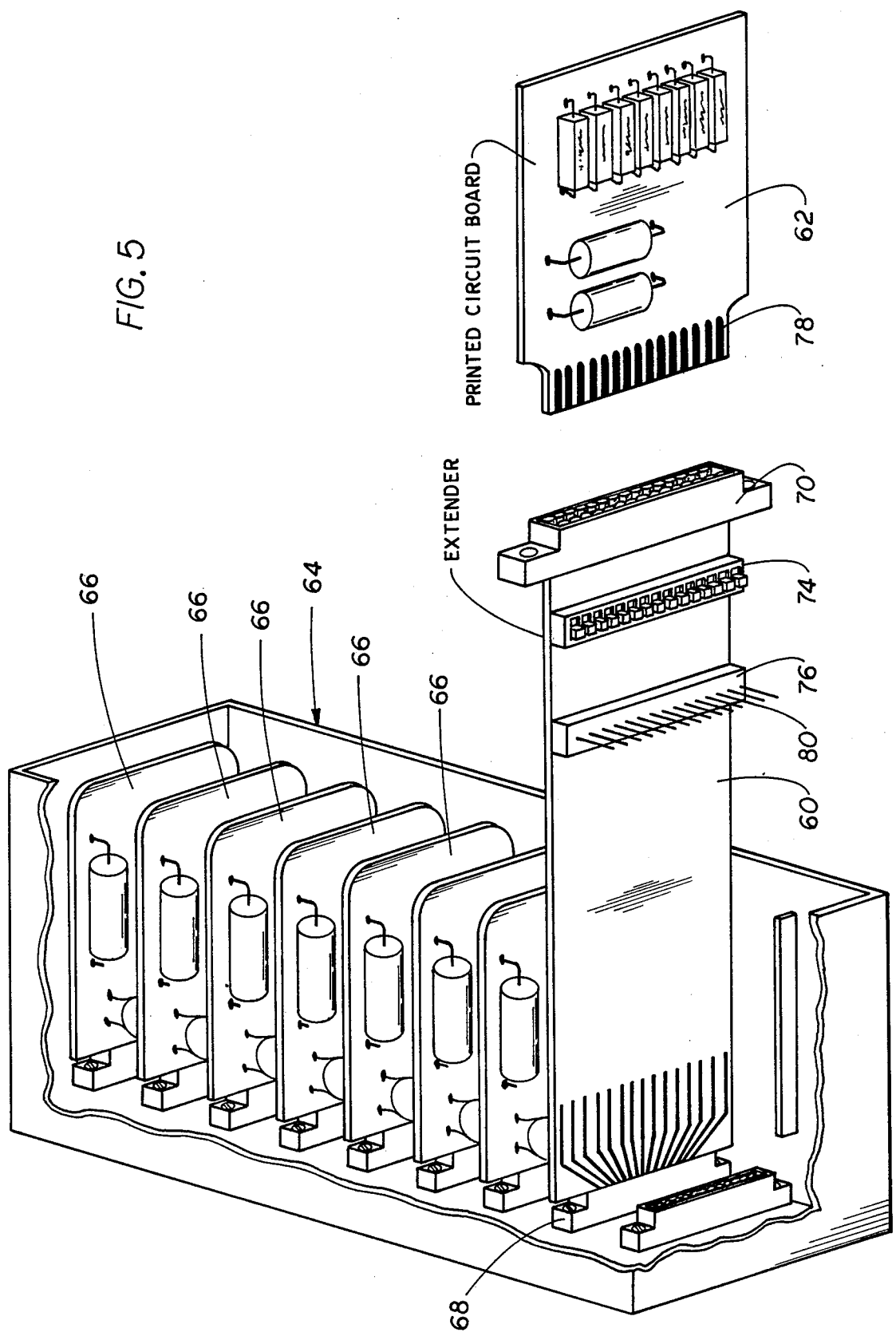
FIG. 5 is an exploded perspective view of a test device of the present invention as applied to a printed circuit board extender.

FIG. 5 shows a modification of the present invention in which a printed circuit board extender 60, physically spaces a P.C. board 62 from an electronic device 62 which contains a series of closely spaced P.C. boards 66. The The extender plugs into the socket 68 and the P.C. board plugs into the card edge connector 70. The extender 60 is shown with a series of switches 74 which, when opened, isolate the series of test points 76 from the P.C. board 62. As previously noted, each switch separates a single P.C. board terminal 78 from a single test point 80.

Figure 6:
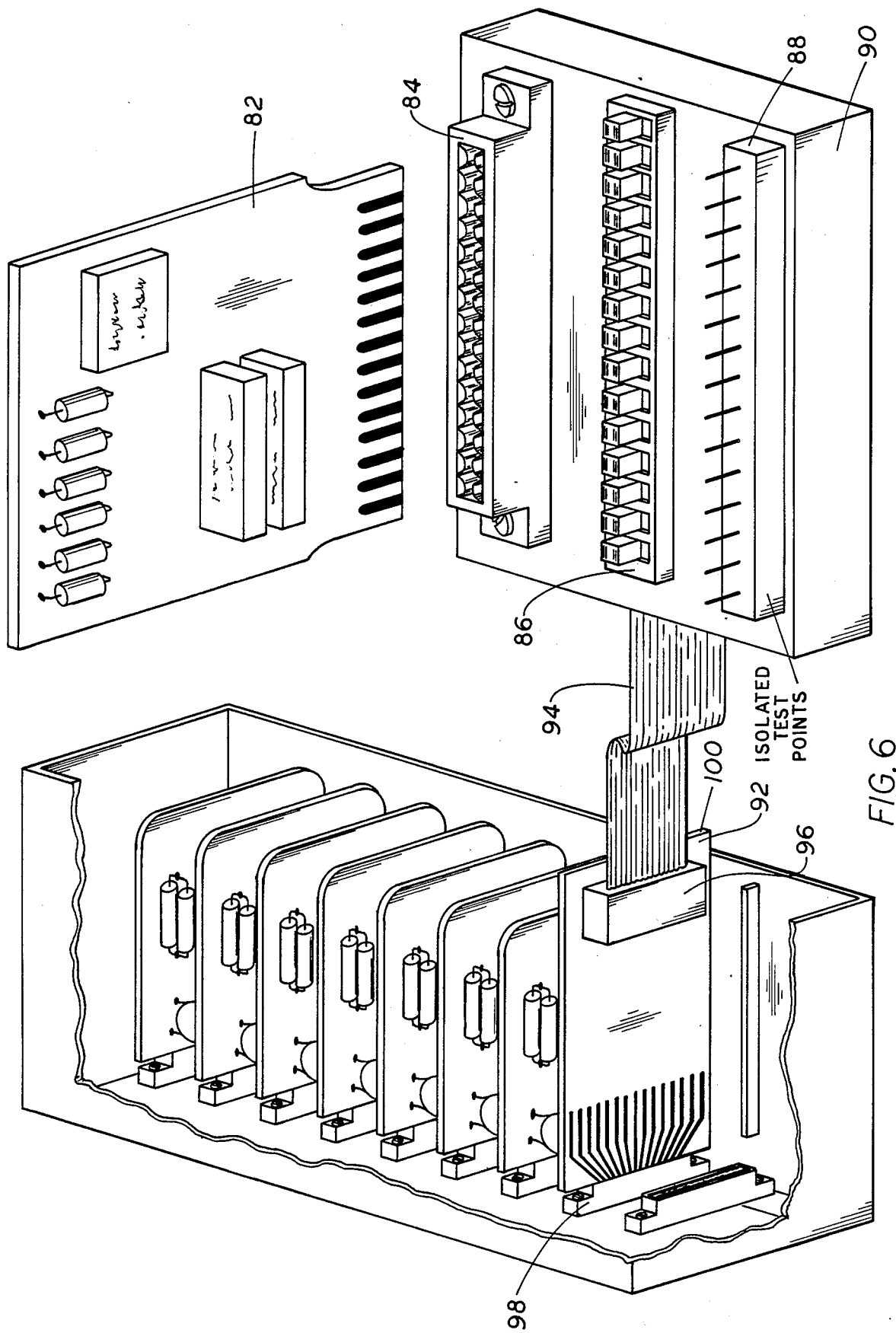
FIG. 6 is an exploded perspective view of a modified form of a test device of the present invention employed with a socket for a printed circuit board.

FIG. 6 shows a preferred variation of a test device for use with a P.C. board. The P.C. board 82 plugs into the card edge connector 84. The switches 86 are electrically between the connector 84 and the isolated test points 88. The electrical conductor, not shown, is contained within the support member 90. The test points 88 are connected to a plug assembly 92 by a ribbon cable 94. The terminal connector 96 can plug directly into the card edge terminal 98, or as shown, can plug into an extender card 100, which in turn plugs into the card edge terminal 98.

As previously noted, unisolated test points can also be provided as illustrated in FIG. 2.

The test device has a further related, although different kind of use, in conjunction with the testing of prototype devices. It is well recognized that a series of individual circuit components can be perfectly designed and operate perfectly but in combination with any one or more other circuit components, inefficient or inadequate results occur due to adverse interaction or interference.

The instant device can be used to run test evaluations of a prototype device, on a building block basis. That is, on a stepwise basis, each building block or subcircuit can be individually tested on an individual basis and then in conjunction with any one or more building blocks or subcircuits until every building block and every combination has been tested.

The term switch, as employed herein, is used in accordance with common usage to mean a mechanical device which can repeatedly open or close a connection in an electric circuit. The term is not inclusive of a pair of wire cutters and a soldering iron or pair of pliers, even though these devices can make or break electrical connections. Unlike wire cutters, etc., switch has a mechanical member which can be reliably and repeatedly moved into and out of contact with contact members, in order to provide the desired on-off function.

By way of further explanation, it should be understood that a switch includes a member which is movable along a fixed path so as to provide reproducible results over an indefinite, extended period and which provides electrical insulation, thereby assuring safe and convenient use by an operator.

Background as to the common usage of the term switch can be obtained from the following definitions.

Switch

"[Elec.] An apparatus for turning electric current from one wire to another, or by which an electric connection is made or broken, the button or other part by moving which a switch is put in Operation."

The Dictionary of Scientific and Technical Terms, McGraw-Hill, 1984, defines switching device as:

Switch

"[Elec.] A manual or mechanically actuated device for making, breaking, or changing the connections in an electric circuit."

Switch Function

"[Electr] A circuit having a fixed number of inputs and outputs designed such that the output information is a function of the input information, each expressed in a certain code or signal configuration or pattern."

Switching Device

"[Eng] An electrical or mechanical device or mechanism, which can bring another device or circuit into an operating or non-operating state. Also known as switching mechanism."

Device

"[Eng] A mechanism, tool, or other piece of equipment designed for specific uses."

"[Electr] An electronic element that cannot be divided without destroying its stated position; commonly applied to active elements such as transistors and transducers."

The Dictionary of Business and Scientific Terms, David F. Tver, Gulf Publishing Company, Houston, Tex., 1968, defines switch:

Switch

"[Physics] A device for easily and safely completing and breaking an electrical circuit."

The Encyclopedia of Science and Technology, McGraw-Hill, 1977, defines switch as:

Switch

"electric: A device that makes, breaks, or changes the course of an electric circuit. Basically, an electric switch consists of two or more contacts mounted on an insulating structure and arranged so that they can be moved into and out of contact with each other by a suitable operating mechanism."

What is claimed is:

1. The method of employing an apparatus for detecting a fault in a first plug-in component of an electronic circuit, said first plug-in component having a plurality of inputs, a plurality of outputs, and a plurality of subcircuit components associated with each of said inputs and said outputs, and normally being received in a second socket in said electronic circuit, wherein said apparatus device comprises:

a first socket means for electrically receiving and contacting each of said inputs and outputs of said first plug-in component;

a second plug-in component having a plug configuration corresponding to the plug configuration of said first plug-in component and being electrically received in said second socket;

connector means electrically connecting said first socket means and said second plug-in component, and a first test point extending from said device, and switch and a second test point extending from said device in series between each of said inputs and outputs of first plug-in component and said second plug-in component, comprising the steps of:

a. placing all switches in the "off" position, b. starting with a first test point - switch -test point unit, placing said first unit in the "on" position, c. testing a first subcircuit associated with said first test point - switch - test point unit by taking readings at the test points electrically connected to the input and output sides of said first subcircuit, d. placing the next test point - switch - test point unit in said sequence in the "on" position and repeating the test steps of (c) for the subcircuit combination electrically associated by said second test point - switch - test point unit, e. repeating step (d) until the entire combination of subcircuits have been tested, f. starting with the second test point - switch - test point unit, repeating step (d), g. starting sequentially with each next test point - switch - test point repeating steps (d) and (e) until every combination of subcircuits, for each start point, has been tested.

* * * * *